(12) United States Patent
Huang et al.

(10) Patent No.: US 6,351,837 B1
(45) Date of Patent: Feb. 26, 2002

(54) HIGH SPEED BUILT-IN SELF-TEST CIRCUIT FOR DRAMS

(75) Inventors: Shi-Yu Huang, Tainan; Ding-Ming Kwai, Taipei, both of (TW)

(73) Assignee: Taiwan Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 09/290,384

(22) Filed: Apr. 12, 1999

(30) Foreign Application Priority Data

Feb. 23, 1999 (EP) .............................................. 99103478

(51) Int. Cl.[7] .............................................. G01R 31/28
(52) U.S. Cl. ........................ 714/733; 714/738; 714/724
(58) Field of Search ...................... 395/500.44; 714/720, 714/112, 738, 724, 733, 728, 7; 713/600

(56) References Cited

U.S. PATENT DOCUMENTS

| 3,831,148 A |   | 8/1974  | Greenwald et al. ........... 714/31 |
|-------------|---|---------|-------------------------------------|
| 4,049,956 A |   | 9/1977  | Van Veen .................... 714/718 |
| 5,329,471 A | * | 7/1994  | Swoboda et al. ...... 395/500.44    |
| 5,557,619 A | * | 9/1996  | Rapoport .................... 714/733 |
| 5,673,271 A |   | 9/1997  | Ohsawa ...................... 714/718 |
| 5,748,640 A | * | 5/1998  | Jiang et al. .................. 714/720 |
| 5,778,419 A | * | 7/1998  | Hansen et al. ............... 711/112 |
| 5,961,653 A | * | 10/1999 | Kalter et al. ................... 714/7 |
| 6,061,817 A | * | 5/2000  | Jones et al. .................. 714/738 |
| 6,122,760 A | * | 9/2000  | Grosch et al. .............. 714/724 |
| 6,128,749 A | * | 10/2000 | McDonnell et al. ........ 713/600 |

FOREIGN PATENT DOCUMENTS

| EP | 0805460 A1 | 4/1997 |
| EP | 0859367 A2 | 2/1998 |

* cited by examiner

Primary Examiner—David Ton
(74) Attorney, Agent, or Firm—Blakely Sokoloff Taylor & Zafman, LLP

(57) ABSTRACT

A high-speed built-in self-test (BIST) circuit for dynamic random access memory (DRAM) is disclosed. The circuit automatically generates a sequence of pre-defined test patterns for on-chip DRAM testing. The circuit includes two finite state machines, instead of the conventional single finite state machine. Therefore, a pipeline technique can then be applied to divide the pattern generation process into stages, leading to a higher-speed design. In addition to pipelining, protocol-based relaxation is also presented. This technique, imposing a certain protocol on the two communicating finite state machines, further relaxes the timing criticality of the design.

7 Claims, 5 Drawing Sheets

X0 : if(next_instruction = NOP)
X1 : if(next_instruction = READ)
X2 : if(next_instruction = WRITE)
X3 : if(next_instruction = READ_A_ROW)
X4 : if(next_instruction = WRITE_A_ROW)
X5 : if(next_instruction = RWR_A_ROW)
X6 : if(next_instruction = REFRESH_A_ROW)

HIGH SPEED BUILT-IN SELF-TEST CIRCUIT FOR DRAMS

Priority Claim

Applicants hereby claim foreign priority benefits under Title 35, United States Code, Section 119 (a)–(d) from European patent application filed Feb. 23, 1999 entitled "Built-In Self-Test Circuit for Memory" accorded patent application number 99103478.6.

FIELD OF THE INVENTION

The present invention relates to the testing of dynamic random access memory (DRAM). More specifically, this invention relates to a built-in self-test circuit for DRAM using two finite state machines.

BACKGROUND OF THE INVENTION

One objective of built-in self-test (BIST) for random access memory (RAM) is to translate a test algorithm into a sequence of commands, data, and addresses applied to the memory under test. In the prior art, a variety of techniques have been utilized to provide BIST for RAM. Traditionally, a hard-wired finite state machine is used to implement the translation process. To provide the capability of at-speed testing, the BIST circuit must operate as fast as the memory under test. A disadvantage of this approach is that the finite state machine is tailored to a specific set of test patterns whose complexity depends on the test algorithm. As the complexity of the test algorithm increases, this approach may be inadequate because the finite state machine may become too large and too slow to produce a test pattern in each clock cycle to intensively exercise the memory under test.

Other BIST circuits, known to be programmable or configurable, provide a certain amount of flexibility by configuration variables that determine the specific test pattern and sequence to be applied to the memory array. For example, U.S. Pat. No. 5,173,906 entitled "Built-in Self Test for Integrated Circuits" (issued Dec. 22, 1992 to Dreibelbis et al.) discloses a circuit that provides both fixed and programmable test patterns for a RAM array. U.S. Pat. No. 5,224,101 entitled "Micro-Coded Self-Test Apparatus for a Memory Array" (issued Jun. 29, 1993 to Popyack, Jr.) discloses a circuit that uses a micro-coded sequence defined in a read-only memory to produce the test patterns. U.S. Pat. No. 5,301,156 entitled "Configurable Self-Test for Embedded RAMs" (issued Apr. 5, 1994 to Talley) discloses a circuit that has a serial path that passes through the address, command, and data portions of the circuit to shift in a test or control pattern and to shift out the results, each scan requiring several clock cycles.

Each of these prior art techniques exhibits one or more drawbacks. Therefore, what is needed is a BIST circuit that is simple to implement and can handle high speeds.

SUMMARY OF THE INVENTION

A built-in self-test (BIST) circuit for a DRAM is disclosed. The BIST circuit comprises: a producer for producing a sequence of macro-instructions corresponding to a sequence of test patterns for input to said DRAM, said sequence of macro-instructions for implementing an underlying test algorithm; a scheduler for processing each individual macro-instruction in said sequence of macro-instructions into a sequence of one-hot encoded test patterns, each one-hot encoded test pattern including a memory command portion; a first-in first-out queue for synchronizing the provision of macro-instructions to said scheduler from said producer; an encoder for mapping said memory command portion of said one-hot encoded test pattern generated by said scheduler to a code defined by the DRAM; an output buffer for serving as a buffer between the BIST circuit and the DRAM; a delay buffer for delaying an expected memory response; and a comparator for comparing an output responses of the DRAM with the expected memory response from said delay buffer to determine if the function of the DRAM is correct.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
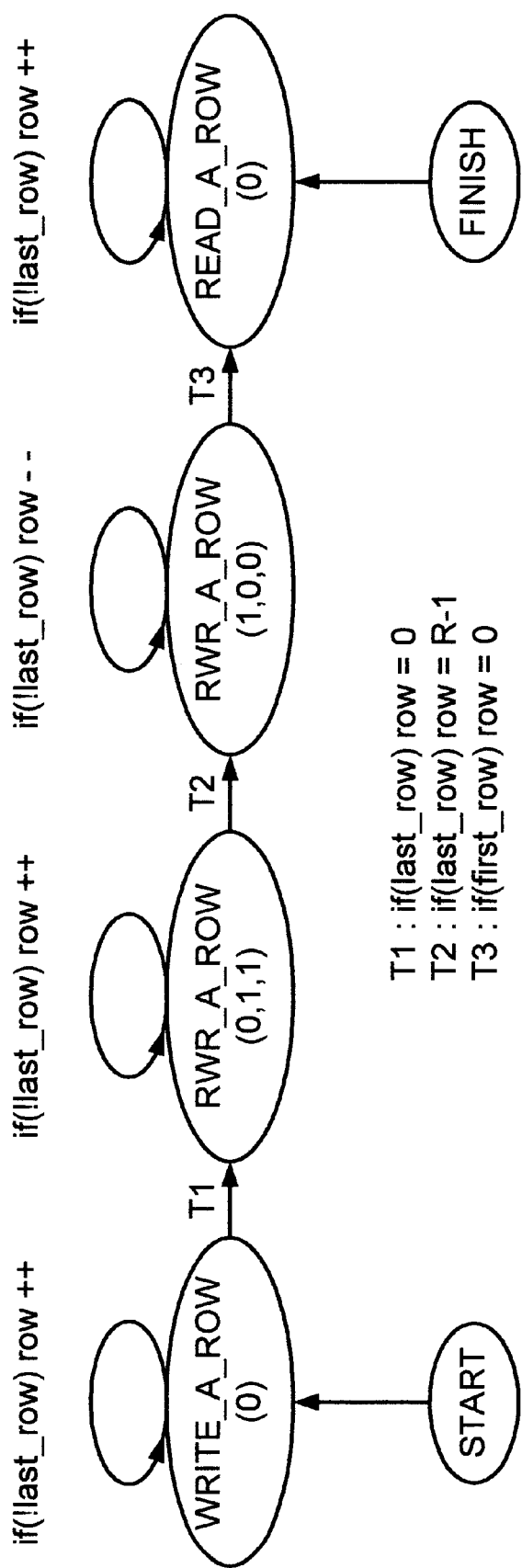
FIG. 1 is a state transition graph for the "march" testing algorithm as implemented by the present invention.

The present invention describes an embedded apparatus that can be used to test DRAM. Initially, definitions of terminology used herein is provided. With the terminology provided, a description of the basic idea, architecture, synchronization mechanism, and speed-up techniques are presented. Finally, synthesis results are presented.

1. Terminology a. "memory command": a basic activity of the memory under test. For a DRAM, it could be one of {mem_nop, mem_active, mem_read, mem_write, mem_precharge, mem_refresh}, where mem_nop: performs no operation.
 mem_active: activates the wordline of a row.
 mem_read: issues a memory read command.
 mem_write: issues a memory write command.
 mem_precharge: brings columns' voltages to a precharged level.

The details of the physical activities of the DRAM with respect to these commands is well known in the art and can be found in A. K. Sharma, Semiconductor Memories, Technology, Testing, and Reliability, IEEE Press, 1996.

b. "memory operation": the entire sequence of memory commands needed to complete a read/write cycle from/to a specific memory cell is called an operation, denoted as READ/WRITE. For example, a READ operation to a memory cell may be composed of the sequence of {mem_active →mem_nop→mem_read→mem_nop→mem_precharge}.

c. "test pattern": a valid input combination to the memory, consisting of four parts: memory command, data value, row address, and column address.

d. "test algorithm": a sequence of test patterns that is to be generated by the BIST circuitry and to be applied to the memory device.

For example, to see how the above terminology is used, one well known test algorithm referred to as the "march algorithm" is described. Assume that the memory array under test has R rows and C columns. A march algorithm could consist of four steps as shown below. The first step writes a 0 to every cell. The second step walks through the entire array in a forward manner (i.e., from the first cell in the first row to the last cell in the last row). At each cell, a READ(0)-WRITE(1)-READ(1) operation is performed. The READ-WRITE-READ operation is believed to better expose the potential dynamic defects of the memory cells. The third step walks through the entire array from the last cell to the first cell. At each cell, a READ(1)-WRITE(0)-READ(0) operation is performed. The final step of this algorithm checks if every cell's value is still zero after the first three steps.

A psuedocode representation of the march algorithm is provided below:

```
march_algorithm(R, C)
{
/*step 1: write 0 to each cell---*/
foreach_row(i=0; i<R; i++){
   foreach_col(j=0; j<C; j++) {Write 0 to cell(i, j);}
}
/*---step 2: change each cell from 0 to 1 in a forward
   manner---*/
foreach_row(i=0; i<R; i++){
   foreach_col(j=0; j<C;D?]
      Read 0 from cell(i, j)
      Write 1 to cell(i, j);
      Read 1 from cell(i, j)
   }
}
/*---step 3: change each cell from 1 to 0 in a backward
   manner---*/
foreach_row(i=(R-1); i>=0; i--){
   foreach_col(j=(C-1); j>=0; j--D?]
      Read 1 from cell(i, j)
      Write 0 to cell(i, j);
      Read 0 from cell(i, j)
   }
}
/*---step 4: read 0 to each cell---*/
foreach_row(i=0; i<R; i++){
   foreach_col(j=0; j<C; j++){Read 0 from cell(i, j); }
   }
}
```

2. A Two-stage Translation Scheme

The main objective of the BIST circuitry of the present invention is to translate a number of high-level abstract test algorithms into a sequence of test patterns. In order to provide the capability of at-speed testing, the BIST circuitry needs to operate at least as fast as the memory device under test. Traditionally, a single finite state machine is used to model the translation process. However, as the complexity of the test algorithm grows, the single finite state machine may become too large and thus too slow to produce a test pattern for every clock cycle when applied to high-speed memory devices.

Therefore, the present invention is a high-speed BIST architecture comprising dual finite state machines. The philosophy behind this architecture is to perform the translation in stages. The first stage translates the test algorithm to a sequence of macro-instructions (defined below), while the second stage further interprets each macro-instruction into a sequence of test patterns. The immediate advantage of this approach is that both finite state machines used to model the process of the two translation stages are much smaller than the one used in the single state machine based design.

A macro-instruction corresponds to a sequence of test patterns. A macro-instruction is expressed by a four-tuple (opcode, data, row-address, column-address), where the parameters data, row-address, and column-address may be "don't care" as represented by "*". Overall, in the present invention, the following seven types of macro-instructions are used:

(NOP, *, *, *): corresponds to the test pattern (mem_nop,*,*,*).

(READ, v, r, c): reads an expected value v from the cell with row address r and column address c. This macro-instruction corresponds to a basic read cycle.

(WRITE, v, r, c): writes a binary value v to the cell with row address r and column address c. This macro-instruction corresponds to a basic write cycle.

(READ_A_ROW, v, r, *): reads an expected value v from every cell in row r sequentially.

(WRITE-A-ROW, v, r, *): writes a binary value v to every cell in row r sequentially.

(RWR_A_ROW, v, r, *): performs the READ-WRITE-READ operation to every cell in row r sequentially. The three data values for the operation depends on the value of v. If v is 0, then READ(0)-WRITE(1)-READ(1) is performed. On the other hand, if v is 1, then READ (1)-WRITE(0)-READ(0) is performed.

(REFRESH_A_ROW, *, r, *): refreshes the contents of every cell in row r.

Assume that the memory array under test has R rows and C columns.

Figure 2A:
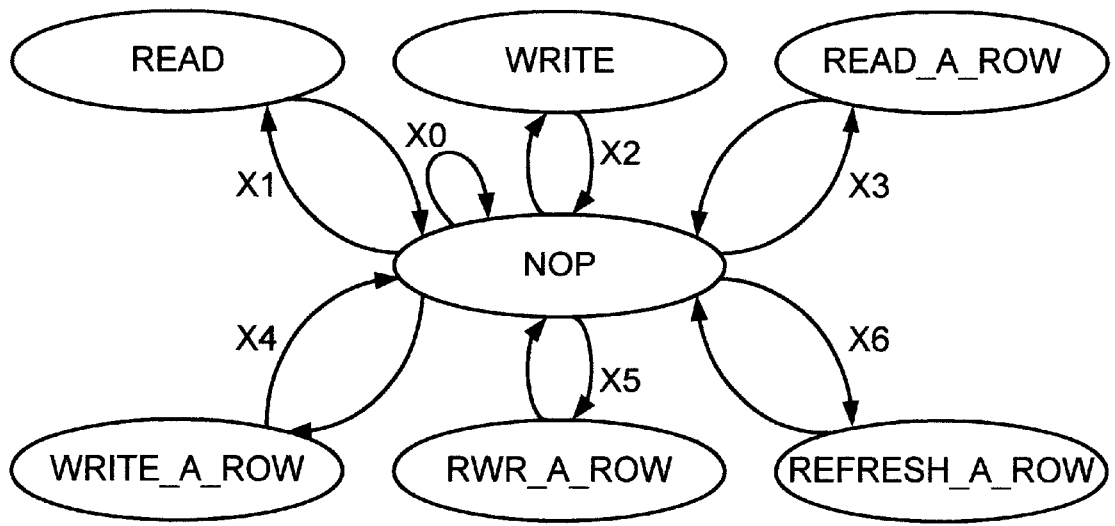
FIG. 2A is a state transition graph for the "scheduler" portion of the present invention.
Figure 2B:
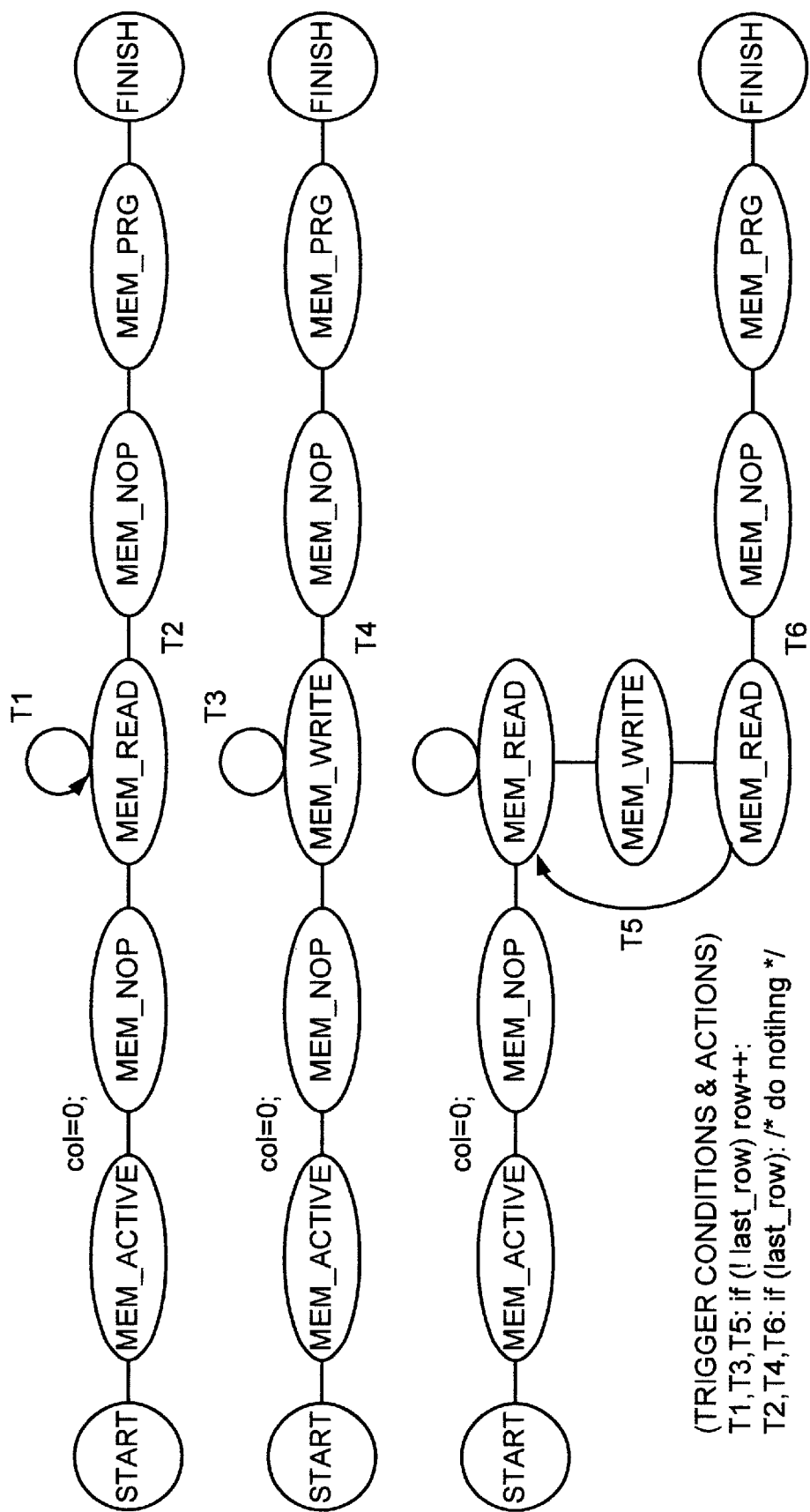
FIG. 2B is a state transition graph of three sub-machines used in implementing the "march" testing algorithm in accordance with the present invention.

FIGS. 1 and 2, respectively, show the state transition graphs of the two state machines for implementing the march algorithm (outlined above). Both machines operate along with an incrementer that keeps track of the row address and/or column address (represented by variables row and col). The first machine (shown in FIG. 1) contains four symbolic states excluding the start and finish state. Each transition is associated with a trigger condition and an operation. The trigger condition is the condition that needs to be satisfied in order to exercise the associated transition, while the operation is the action to be taken with the transition.

For example, if the present state is the state labeled WRITE_A_ROW(0) and the row address is the last (i.e., row =R - 1), then the machine will take the transition labeled T1 and the following actions:

produce a macro-instruction (WRITE_A_ROW, 0, row, *).

set the variable row to 0.

go to the next state labeled RWR_A_ROW(0,1,1)'.

The second machine (shown in FIGS. 2A and 2B), taking the macro-instructions generated by the first machine as inputs, is a hierarchical state machine with seven sub-machines. Each sub-machine is used to interpret one type of macro-instruction. For simplicity, only the three sub-machines needed for the march algorithm described above is shown (i.e., READ_A_ROW, WRITE_A_ROW, and RWR_A_ROW). Note that more sophisticated test algorithms in DRAM testing, (e.g., the commonly used row disturb algorithm), may need all macro-instructions.

3. The Architecture

Figure 3:
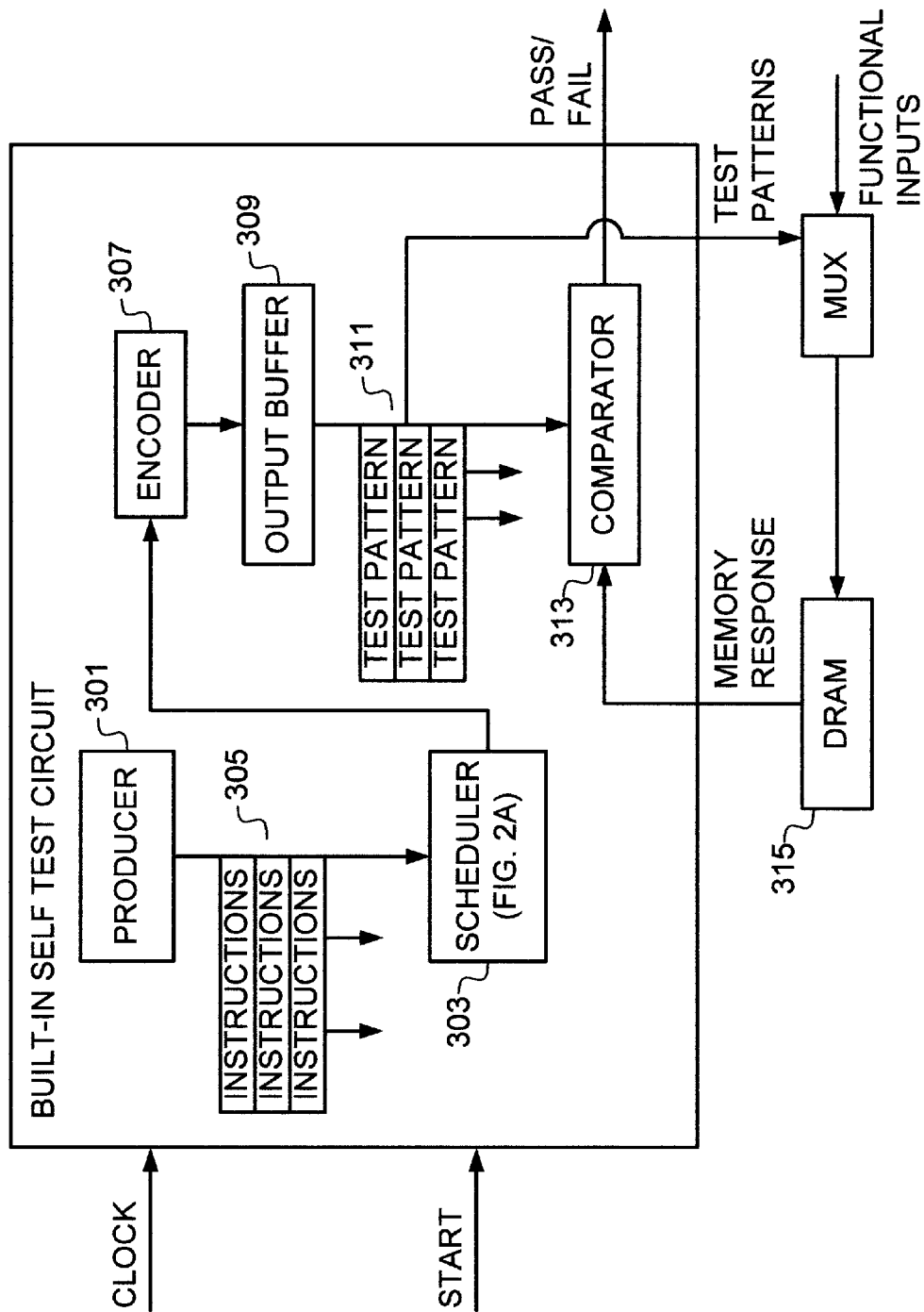
FIG. 3 is a diagram illustrating the architecture of the present invention.

FIG. 3 shows a block diagram of the three-stage pipelined design of the present invention. There are seven major components in the circuit: producer 301, scheduler 303, queue 305, encoder 307, memory output buffer 309, delay buffer 311 and comparator 313.

(1) producer 301 is a finite state machine that produces a sequence of macro-instructions. This machine, related to the underlying test algorithms, forms the first stage of the pipeline.

(2) scheduler 303 is a finite state machine that interprets each macro instruction into a sequence of test patterns, in which the memory command parts are one-hot encoded. In one-hot encoding, each state is represented by a binary code in which only one bit is 1 while the others are 0. This component, related to the interface with the memory device, forms the second stage of the pipeline.

(3) queue 305 is a first-in-first-out register file, serving as a synchronization buffer between the two finite state machines. It takes the macro-instructions generated by the producer 301 as the inputs and feeds the scheduler 303 with the buffered macro-instructions one by one. The only operation associated with this queue is latch-and-shift-forward. As will be described later, it is controlled by a signal next issued by the scheduler. When the signal next is asserted, the queue performs a shift-forward operation and latches in a new instruction generated by the producer' at the same clock cycle. On the other hand, if the signal next is de-asserted, the queue performs no operation.

(4) encoder 307 is a piece of combinational logic that maps the encoding of each memory command in the test patterns generated by scheduler 303 from one-hot code to the one defined by the DRAM memory 315. For example, suppose the input vector to the encoder 307 is (00001, 0, 0, 0), where 00001 represents the one-hot code of the memory command mem_read. Then, the output of the encoder 307 could be (0101, 0, 0, 0), if 0101 is the binary code of mem_read defined by the memory device. Note that this component forms the third stage of the pipeline.

(5) BIST output buffer (BOB) 309 is a register that serves as a buffer between the BIST circuit and the memory. This buffer eliminates the potential performance degradation of the memory device due to the introduction of the BIST circuit.

(6) delay buffer 311 is a first-in-first-out register file between the BIST output buffer and the comparator. It is primarily for computing the expected responses of the memory read command. The number of clock cycles delayed from BOB to the comparator corresponds to the CAS-latency defined by the DRAM 315.

(7) comparator 313 is a piece of combinational logic that compares the output responses of the DRAM memory 315 with the expected values to determine if the memory is functionally correct, where the expected values are provided through the delay buffer. For example, if a test pattern (mem_read, 1, 0, 0) is applied to the memory device and the CAS-latency is two, then two clock cycles later, the memory device is supposed to produce a 1 at the data output. Meanwhile, the same test pattern should arrive at the comparator 313 through the delay buffer 31 1 and the data part 1 of the test pattern (mem_read, 1, 0, 0), can be extracted as the expected value for the comparison.

4. Synchronization Mechanism

There are three stages in this pipelined design: macro-instruction generation via the producer 301, macro-instruction scheduling via the scheduler 303, and memory command encoding via the encoder 307. In general, the producer 301 is capable of producing one macro-instruction every clock cycle. However, the scheduler 303 could take multiple clock cycles to complete the processing of a macro-instruction (e.g., a READ_A_ROW). Therefore, the producer 301 may have to be "stalled" from time to time in order not to overload the scheduler 303 with excessive macro-instructions.

Figure 4:
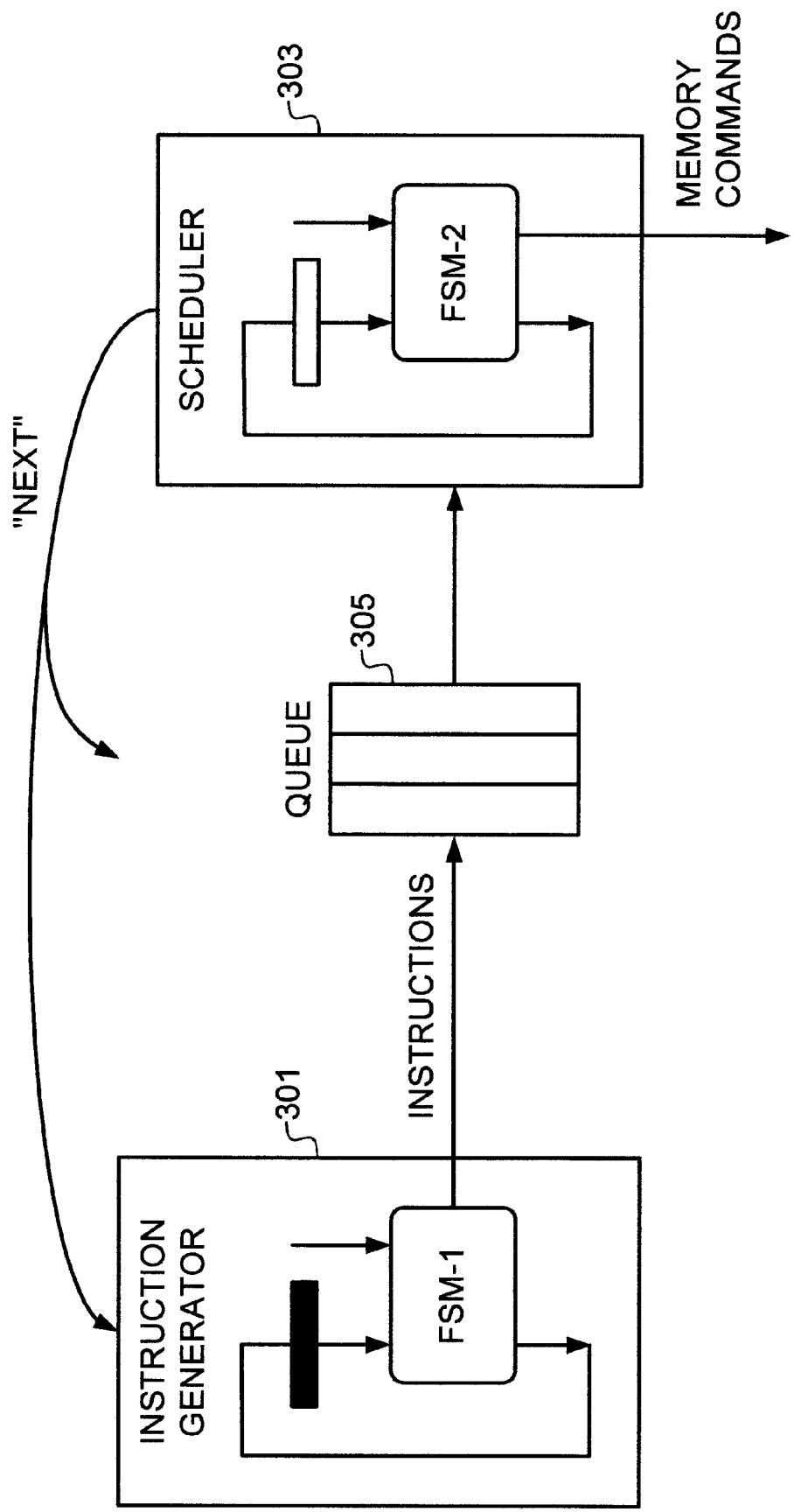
FIG. 4 is a diagram illustrating a master-slave synchronism used in the present invention.

As shown in FIG. 4, a master-slave synchronization mechanism is used. The scheduler 303 is the master who controls the actions of the producer 301 and the synchronization queue through a signal named next. When the signal next is low, the producer 301 and the queue 305 are frozen (i.e., the value of every flip-flop remains unchanged regardless of the clocking). On the other hand, as the signal next is raised to high, the current macro-instruction produced by the producer 301 is inserted to the queue 305 at the specified clock edge. Meanwhile, the producer 301 enters the next state to compute the next macro-instruction.

5. Speed-Up Techniques

In addition to the commonly used high-performance design techniques, such as one-hot encoding and retiming, a further technique called protocol-based relaxation is used to boost the circuit's speed. This technique is based on an observation that, among the three stages, the timing critical paths are mostly in the producer. To relax the timing criticality, the producer is transformed into a multi-cycle path component, (i.e., a component producing one result for every two clock cycles or more). Since the scheduler controls the action of the producer, this can be achieved by modifying the scheduler. The modification needs to be done in such a way that the signal next will not be raised to high for two consecutive clock cycles.

All the macro-instructions that are discussed earlier take more than one clock cycle to execute, except NOP which originally corresponds to a single test pattern (mem_nop, *, *, *). In order to comply with the above protocol, the interpretation of this macro-instruction is changed to two mem_nop memory patterns, i.e., $$NOP=(mem\_nop, *, *, *) \rightarrow (mem\_nop, *, *, *)$$

The increase in test time due to this modification is negligible, while the performance speedup is significant.

6. Synthesis Results

The present invention has been implemented as an RTL code. It has been simulated with the functional model of the memory device under test to establish the confidence of its functional correctness. A publicly available synthesis tool, Design Compile, is used to convert the RTL code into a netlist and perform logic optimization using a 0.25 um CMOS technology library. The publicly available static timing analysis tool, Design Time, shows that the clock cycle time is under 2.21 ns. Further, the timing-driven feature of a place-and-route tool, Apollo, is used to generate the layout. Post-layout timing checks shows that there are no timing violations under the above clock cycle time. Based on these results, the present invention has great potential to run as fast as 450 MHz.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A built-in self-test (BIST) circuit for a DRAM comprising:

a producer for producing a sequence of macro-instructions corresponding to a sequence of test patterns for input to said DRAM, said sequence of macro-instructions for implementing an underlying test algorithm;

a scheduler for processing each individual macro-instruction in said sequence of macro-instructions into a sequence of one-hot encoded test patterns, each one-hot encoded test pattern including a memory command portion;

a first-in first-out queue for synchronizing the provision of macro-instructions to said scheduler from said producer;

an encoder for mapping said memory command portion of said one-hot encoded test pattern generated by said scheduler to a code defined by the DRAM;

an output buffer for serving as a buffer between the BIST circuit and the DRAM;

a delay buffer for delaying an expected memory response; and a comparator for comparing an output response of the DRAM with the expected memory response from said delay buffer to determine if the function of the DRAM is correct.

2. The circuit of claim 1, wherein said macro-instructions are comprised of a predefined sequence of memory commands.

3. The circuit of claim 1, wherein said one-hot encoded test pattern includes a one-hot code that is used for encoding the states of the producer and scheduler.

4. The circuit of claim 1, wherein said one-hot encoded test pattern includes a one-hot code that is used for encoding the outputs of the producer and scheduler.

5. The circuit of claim 1, wherein said producer, said scheduler, and said encoder forms a three stage pipeline and said encoder is formed from combinatorial logic.

6. The circuit of claim 1, wherein a master-slave synchronization mechanism is used to regulate the communication between the producer and scheduler, said scheduler being the master machine and said producer being the slave machine, wherein upon completion of formulation of a macro-instruction by the scheduler, the scheduler generates and transmits a next signal to said producer and retrieves the next macro-instruction from said first-in first-out queue between the producer and scheduler, further wherein said producer, upon receipt of said next signal, generates a new macro-instruction and inserts it into the first-in first-out queue.

7. The circuit of claim 6, wherein said scheduler does not generate said next signal in consecutive clock signals.

* * * * *